(12) United States Patent
Kim et al.

(10) Patent No.: US 9,070,903 B2
(45) Date of Patent: Jun. 30, 2015

(54) INORGANIC OXIDE THIN FILM AND METHOD FOR PREPARING THE SAME

(71) Applicant: Samsung Display Co. Ltd., Yongin, Gyeonggi-Do (KR)

(72) Inventors: Dong Chan Kim, Hwaseong-si (KR); Seok Gyu Yoon, Hwaseong-si (KR); Kyu Hwan Hwang, Yongin-si (KR); Eung Do Kim, Seoul (KR); Bo Ra Jung, Seoul (KR); Dong Kyu Seo, Suwon-si (KR); Won Jong Kim, Suwon-si (KR); Young Woo Song, Suwon-si (KR); Jong Hyuk Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 93 days.

(21) Appl. No.: 14/029,158

(22) Filed: Sep. 17, 2013

(65) Prior Publication Data

US 2014/0339511 A1 Nov. 20, 2014

(30) Foreign Application Priority Data

May 15, 2013 (KR) .......................... 10-2013-0055085

(51) Int. Cl.
*H01J 1/62* (2006.01)
*H01L 51/52* (2006.01)
*G02B 5/00* (2006.01)

(52) U.S. Cl.
CPC ..... *H01L 51/5275* (2013.01); *Y10T 428/24893* (2015.01); *G02B 5/00* (2013.01)

(58) Field of Classification Search
CPC ................. H01L 2924/00; H01L 2224/73265; H01L 2224/48227; H01L 2224/32225
USPC .................................... 313/498, 506
See application file for complete search history.

(56) References Cited

FOREIGN PATENT DOCUMENTS

| KR | 1020020090523 A | 12/2002 |
|---|---|---|
| KR | 1020060083270 A | 7/2006 |
| KR | 1020080055176 A | 6/2008 |
| KR | 1020090094626 A | 9/2009 |

*Primary Examiner* — Vip Patel
(74) *Attorney, Agent, or Firm* — Innovation Counsel LLP

(57) ABSTRACT

A quantum-dots containing multi-component inorganic oxide thin film is provided to include an amorphous inorganic oxide bulk region and a plurality of crystalline inorganic oxide regions, wherein the crystalline inorganic oxide regions are discontinuously formed to be surrounded by the amorphous inorganic oxide of the bulk region.

19 Claims, 6 Drawing Sheets

INORGANIC OXIDE THIN FILM AND METHOD FOR PREPARING THE SAME

CROSS-REFERENCE TO RELATED APPLICATIONS

This application is based on and claims priority from Korean Patent Application No. 10-2013-0055085, filed on May 15, 2013 in the Korean Intellectual Property Office, the disclosure of which application is incorporated herein in its entirety by reference.

BACKGROUND

1. Field of Disclosure

The present disclosure of invention relates to an inorganic oxide thin film and a method for preparing the same, and more particularly to an inorganic oxide thin film, in which crystalline inorganic oxide regions are discontinuously formed to be surrounded by amorphous inorganic oxide, and a method for preparing the same.

2. Description of Related Technology

Display devices may include liquid crystal displays, field emission displays, plasma displays, and electroluminescence type displays.

When such display devices are used, light from a light emitting body is typically emitted into the air for viewing by a user, and as the light passes from a light transmitting material of relatively high refractive index into the air of lower index, a critical refractive threshold angle (relative to an interface normal) above which the light cannot be emitted can be exceeded due to a large difference in the refraction indices of the air and the output material, such that total light extinction occurs due to the total internal reflection phenomenon to thus lower the light output efficiency of the display device.

It would be desirable to have materials and display device structures that can improve the light output efficiencies at the solid to air interface layer of such display devices.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

A quantum-dots containing multi-component inorganic oxide thin film is provided.

A method for preparing the multi-component inorganic oxide thin film is provided.

An organic light emitting display device including the multi-component inorganic oxide thin film is provided.

Additional advantages, subjects, and features of the present disclosure of invention will be set forth in part in the detailed description which follows and in part will become apparent to those having ordinary skill in the art upon examination of the following.

In one aspect, there is provided a multi-component inorganic oxide thin film comprising one or more amorphous inorganic oxides forming a bulk of the film and a plurality of crystalline inorganic oxide regions dispersed in the bulk, wherein the crystalline inorganic oxide regions are discontinuously formed in quantum-dot sized manner to be surrounded by the bulk amorphous inorganic oxide(s).

In another aspect, there is provided a method for preparing a multi-component inorganic oxide thin film, comprising preparing a solution through mixing one or more inorganic oxides that become or remain amorphous at a predetermined temperature (Tc) and an inorganic oxide that becomes crystalline (mono or poly) at the specific temperature (Tc); applying the solution on a base material; forming a thin film through drying or hardening the solution; and forming quantum dots through performing heat treatment of a surface of the thin film at the specific temperature.

In still another aspect, there is provided an organic light emitting display comprising a substrate, an anode, an organic light emitting layer, a cathode, and a multi-component inorganic oxide thin film.

According to the embodiments of the present disclosure of invention, at least the following effects can be achieved.

The light extraction efficiency of the organic light emitting display can be improved through providing the quantum-dots containing multi-component inorganic oxide thin film that can redirect light to avoid loss due to refraction. Further, the multi-component inorganic oxide thin film can be prepared at relatively low temperature.

The effects according to the present teachings are not limited to the content as exemplified above, but further various effects are included in the description.

BRIEF DESCRIPTION OF THE DRAWINGS

The above and other objects, features and advantages of the present disclosure of invention will be more apparent from the following detailed description taken in conjunction with the accompanying drawings, in which.

DETAILED DESCRIPTION

Figure 1:
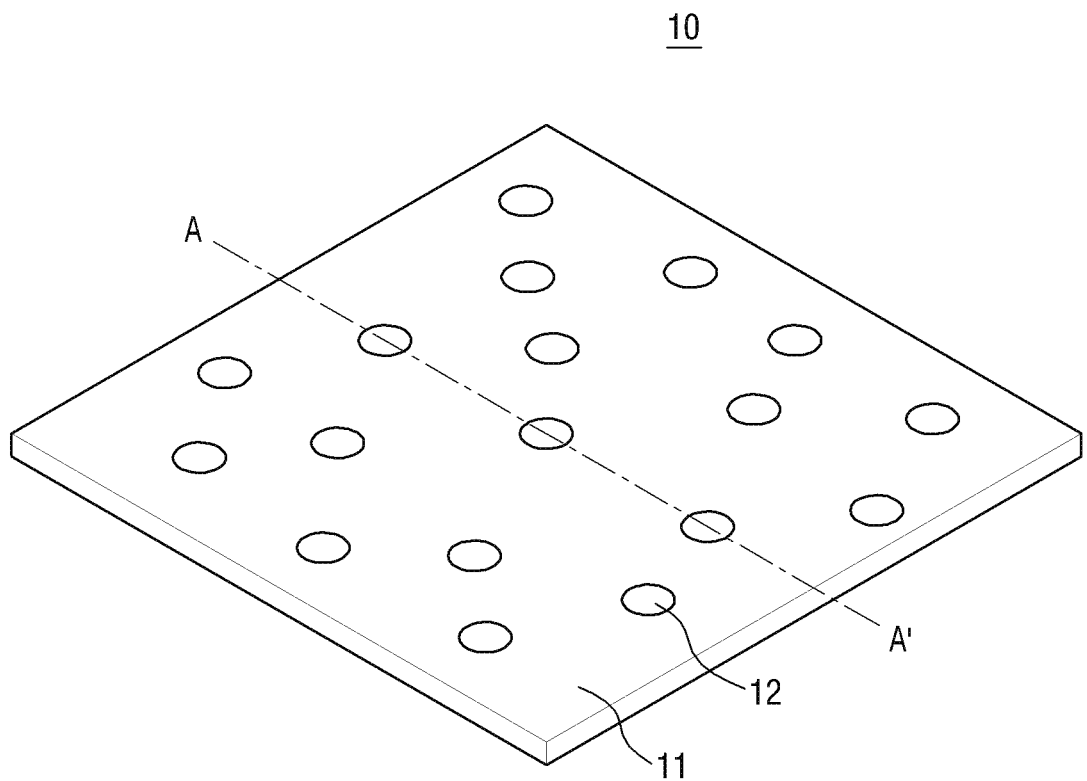
FIG. 1 is a schematic perspective view of a multi-component inorganic oxide thin film according to an embodiment of the present disclosure of invention.

Various aspects and features of the present disclosure of invention and methods for achieving such aspects and features will become more apparent by referring to the embodiments described below in detail with reference to the accompanying drawings. However, the present teachings are not limited to the embodiments disclosed hereinafter, but can be implemented in diverse forms. The matters defined in the description, such as the detailed construction and elements, are merely specific details provided to assist those of ordinary skill in the art in a comprehensive understanding of the present disclosure of invention, and the present teachings are not limited by the illustrative examples given herein.

The term "on" that is used to designate that an element is on another element or located on a different layer or a layer includes both a case where an element is located directly on another element or a layer and a case where an element is located on another element via another layer or still another element. In the entire description of the present disclosure of invention, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Hereinafter, embodiments in accordance with the present disclosure of invention will be described with reference to the accompanying drawings.

Figure 2:
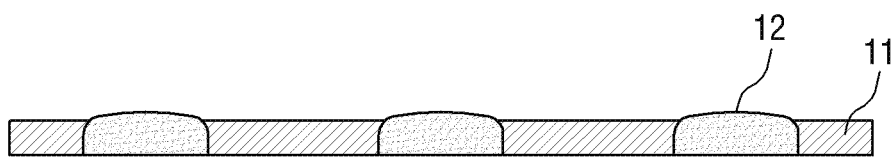
FIG. 2 is a vertical cross-sectional view taken along line A-A' of one embodiment of FIG. 1.
Figure 3:
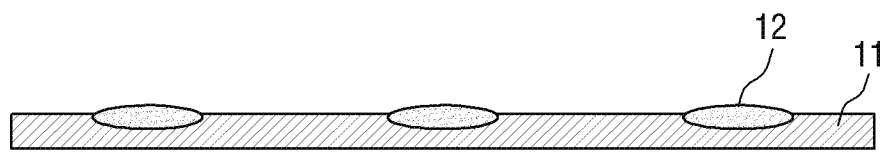
FIG. 3 is a vertical cross-sectional view taken along line A-A' of another embodiment of FIG. 1.

FIG. 1 is a schematic perspective view of an exemplary light-transmitting, multi-component inorganic oxide thin film according to an embodiment of the present disclosure. FIGS. 2 and 3 are vertical cross-sectional views taken along line A-A' of FIG. 1 according to different embodiments of the example shown in FIG. 1.

More specifically, and as will become clearer when various embodiments are detailed, the rounded regions 12 of FIG. 1 are to be understood as defining convex light refracting structures that redirect light passed through them to be angled closer to the normal (perpendicular) of the surface on which they lie so that total internal reflection or effects associated therewith when angle of light ray incidence at an optical materials interface approaches, equals or exceeds the critical angle of refraction.

Referring to the drawings, a light-transmitting, multi-component inorganic oxide thin film 10 includes a bulk portion composed of an amorphous inorganic oxide material 11 and optical processing regions 12 composed of a crystalline inorganic oxide material. The amorphous inorganic oxide material 11 is distributed as a bulk material on the whole surface of the thin film 10. On the other hand, the crystalline inorganic oxide material regions 12 are discontinuously formed so as to be surrounded by the bulk amorphous inorganic oxide material 11.

The crystalline inorganic oxide regions 12 may be formed to protrude or be exposed from both sides of the thin film 10 as shown in FIG. 2, or may be formed to protrude or be exposed from only one side of the thin film 10.

The crystalline inorganic oxide regions 12 are preferably regions of a single crystal inorganic oxide material. The single crystal inorganic oxide material has prominent optical effects in comparison to a polycrystalline form of the same inorganic oxide material so that desired optical effects (e.g., forming a convex lens) may be accentuated by using the single crystal form.

The crystalline inorganic oxide regions 12 illustrated in FIG. 1 may be constituted as respective quantum dots each with an average diameter thereof in the range of 2 nm to 10 nm. If the average diameter thereof is less than 2 nm, the preparation of the crystalline inorganic oxide itself may be difficult, while if the average diameter thereof exceeds 10 nm, the isolated crystalline inorganic oxide regions 12 may merge and mutually grow, and it thus may be difficult for the crystalline inorganic oxide 12 to exist in the form of isolated quantum dots that provide corresponding optical effects.

For both of solar cell technology and light emitting materials technology, the quantum dots arrangement has been spotlighted as a technology offering increasing internal/external quantum efficiencies. Quantum dot structures which have been researched up to now, have mainly been based on CdSe, CdTe, and CdS of group II to group IV combinations. However, use of Cd is to be restricted due to environmental regulations and concerns. Further, problems of deterioration phenomenon due to interaction between particles of quantum dots and remaining of introduced ligand materials are on the rise.

In the multi-component inorganic oxide thin film 10 of FIG. 1, the quantum dots 12 are realized on the basis of self-assembly phase separation behaviors of the materials making up the bulk amorphous inorganic oxide 11 and the precipitated or nucleated crystalline inorganic oxide 12 regions without using Cd in the compositions.

It is preferable that the multi-component inorganic oxide thin film 10 includes the amorphous inorganic oxide 11 and the crystalline inorganic oxide 12 with a weight ratio of 7:3 to 9:1. In the case where the multi-component inorganic oxide thin film has the above-described range of the weight ratio, the crystalline inorganic oxide 12 having the above-described average diameter can be obtained.

The thickness of the multi-component inorganic oxide thin film 10 may be appropriately adjusted in consideration of the desired light permeability or the like, and may be, for example, in the range of 10 nm to 100 nm. If the thickness of the thin film 10 is less than 10 nm, the preparation of the thin film including the quantum dots itself may be difficult, while if the thickness of the thin film 10 exceeds 100 nm, the light permeability may be undesirably decreased, and thus a desired improvement in light emitting efficiency may not be obtained.

The multi-component inorganic oxide thin film 10 may be composed of two kinds of inorganic oxides. In this case, it is preferable that the inorganic oxides are phase-separated to the amorphous inorganic oxide and the crystalline inorganic oxide regions, respectively.

Figure 4:
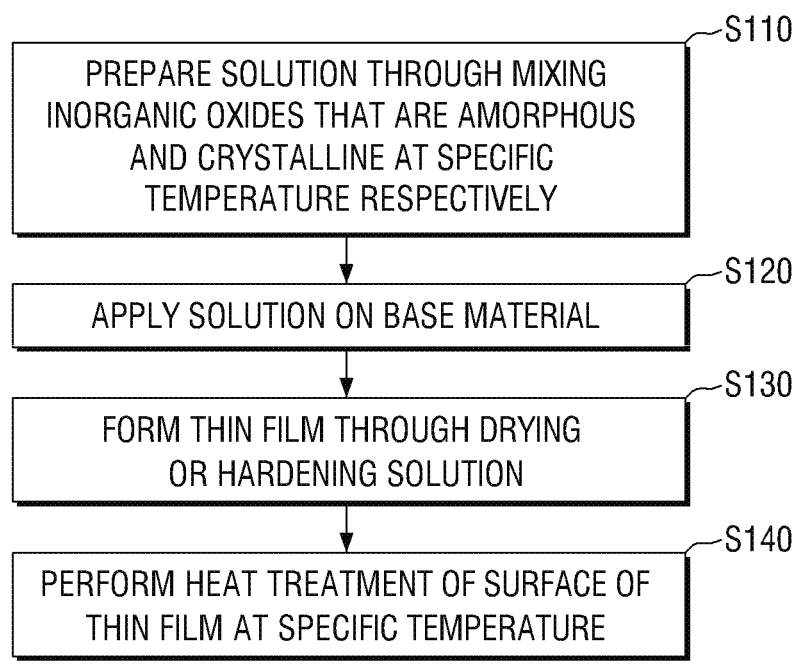
FIG. 4 is a schematic flowchart of a method for preparing a multi-component inorganic oxide thin film according to an embodiment of the present disclosure.

FIG. 4 is a schematic flowchart of a method for preparing a multi-component inorganic oxide thin film according to an embodiment of the present disclosure of invention.

Referring to FIG. 4, a method in accordance with the present disclosure for preparing a quantum-dots containing, multi-component inorganic oxide thin film includes preparing a solution through a mixing to homogenous consistency of a combination of components including different and respective inorganic oxides that can be caused to respectively and become amorphous and crystalline when heated to a same specific temperature, Tc (step S110); depositing the mixed solution on a transparent substrate or other base material (S120); forming a solid thin film through a drying or hardening of the deposited solution (S130); and forming a distribution of quantum dots within the solidified thin film through a performing of a heat treatment of at least a surface of the thin film to thereby raise it to the specific temperature Tc where at least one of the included oxide components becomes amorphous and at least another of the included oxide components becomes mono- or poly crystalline (S140). (As used herein, the condition of becoming amorphous or crystalline includes being heated to the specific temperature Tc and thereafter cooled to room temperature where the attained amorphous or crystalline state is retained during the cooling process.)

More specifically, if the surface of the solidified thin film includes a homogeneous mixture of the respective inorganic oxides that respectively become amorphous and crystalline at the specified temperature Tc, the inorganic oxides; due to nucleating crystallization of the oxide component that becomes crystalline, the respective oxide components become phase-separated into respective areas of amorphous inorganic oxide and nucleated crystalline inorganic oxide. In this case, the crystalline inorganic oxide regions may be discontinuously formed as quantum-dots surrounded by the bulk amorphous inorganic oxide components.

Yet more specifically, in step S110, as the inorganic oxides that are amorphous and crystalline at the specific temperature Tc, respectively, are mixed in accordance with a predetermined ratio that will result in distributively isolated nucleation centers, the homogenous solution may be in a liquid or slurry state, but is not limited thereto.

The method for applying the solution onto the base material is not specially limited, but, for example, a spin coating method may be used where the amount deposited and the spin speed are set to produce a predetermined wet layer thickness and area.

In the thin film formed in step S130, the inorganic oxide(s) that is/are amorphous at the specific temperature Tc and the inorganic oxide that nucleates into a crystalline (mono or poly) at the specific temperature Tc may be homogenously mixed at a molecular resolution level.

The heat treatment in S140 is to heat at least the surface of the thin film in the temperature range of phase separation of the used inorganic oxides. The heat treatment method is not specially limited, but, for example, a laser irradiation method may be used. In the case where the laser irradiation method is used, the heat treatment temperature of the surface of the thin film can be controlled through adjustment of the output laser wavelength(s) and/or the intensity of the laser output, and the process can be completed in a short time with strong localized thermal energy applied to the surface while minimizing heat transfer with respect to a supporting and opposite surface that is opposite to the heat-treated surface. Further, the laser irradiation method has a simplified process and superior reproducibility, and the size and arrangement state of the quantum dots can be easily controlled through adjustment of the irradiation conditions such as variable beam scanning frequency, variable laser pulse application and so forth.

The irradiating the laser may be implemented through laser scanning of a region where the quantum dots are to be formed at a predetermined speed. In this case, the scanning speed may be differently set depending on conditions such as the laser output intensity and current beam position, and the scanning speed may be readjusted periodically, for example using beam position switch points preferably spaced apart in a range of 1 μm to 1000 μm from one another.

The laser is not specially limited in so far as it can apply radiative energy of a kind absorbable into the surface of the thin film. For example, the laser beam may include at least one of UV wavelengths, visible wavelengths, and infrared (IR) wavelengths.

As laser oscillators capable of oscillating the above-described laser, there are excimer laser oscillators, such as KrF, ArF, and XeCl, gas laser oscillators, such as He, He—Cd, Ar, He—Ne, and HF, solid-state laser oscillators having medium in which at least one selected from Nd, Yb, Cr, Ti, Ho, Er, Tm, and Ta is added as a dopant to single crystalline YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$, and semiconductor laser oscillators, such as GaN, GaAs, GaAlAs, or InGaAsP. Further, in the solid-state laser oscillator, it is preferable to properly select and use the basic wave to the fifth harmonic wave.

Further, laser beams of continuous oscillation or laser beams of pulsed oscillation may be appropriately used as the laser. The laser beams of pulsed oscillation generally use an oscillation frequency of several tens of Hz to several KHz, and pulsed oscillation laser, which obtains laser beams of much higher oscillation frequency of 10 MHz or more, pico-second ($10^{-12}$ second) pulse width, or femto-second ($10^{-15}$ second) pulse width, may be used.

The cross-sectional shape of the laser beam may be a circle, an ellipse, a rectangle, or a line (strictly, long thin rectangle).

It is preferable that the output power of the surface irradiating laser is adjusted in the range of about 0.08 W to 1 W, and such a laser may be produced by a general purpose Nd:YAG laser, but is not limited thereto. In a preferred embodiment, the wavelength band of the laser may be a UV region, and may be in the range of about 100 nm to 360 nm.

According to the method for preparing the multi-component inorganic oxide thin film according to the present disclosure, the size and the distribution of the quantum dots can be easily controlled through adjustment of the ratiometric content of the inorganic oxides, adjustment of the output power of the laser, adjustment of the thickness of the thin film, and adjustment of the irradiation frequency(ies).

It is preferable that the irradiating the laser device is laser beam scanning type so that the laser beam can be used to uniformly irradiate a predetermined whole area in which the quantum dots are to be formed. Since the spot size of the laser beam generally used is merely 1 mm or less, the scanning method is used in order to uniformly apply the laser over the whole region to be irradiated.

The laser scanning process may be easily implemented using a galvanometer system. The influence of the laser exerted on the irradiated region depends on the scanning speed. Accordingly, in order to form the quantum dots, it is preferable that the laser scanning speed is in the range of about 1 μm to 1000 μm per second, but is not limited thereto.

The specific temperature at which the phase separation can occur may differ depending on the kind of inorganic oxides used, and for example, may be in the range of 300° C. to 500° C. At a temperature that is lower than 300° C., it is not easy for the phase separation to occur, and at a temperature that is higher than 500° C., the developed thermal energy may exert a warpage or other undesired influence on a significant thickness portion of the thin film.

An example of AN inorganic oxide that becomes amorphous at the specific temperature Tc may be an oxide including magnesium (Mg). An example of an inorganic oxide that becomes crystalline at the specific temperature Tc may be an oxide including one or more members selected from the group of zinc (Zn), tin (Sn), and nickel (Ni).

As an example, the utilized mix of amorphous inorganic oxide(s) and the crystalline inorganic oxide may be expressed by substantially same chemical equations (e.g., $X_jO_k$ versus $X_mO_k$ where X is the non-oxygen inorganic member and j, k and m are integers), and may be multi-component inorganic oxides having different content ratios of the inorganic materials which respectively become amorphous and crystalline at the specific temperature Tc.

It is preferable that the inorganic oxide that is amorphous at the specific temperature and the inorganic oxide that is crystalline at the specific temperature are mixed with a weight ratio of 7:3 to 9:1 respectively. If the weight ratio (Wa/(Wc+Wa)) of the inorganic oxide that becomes amorphous at the specific temperature Tc to the whole inorganic oxide is less than 70%, the crystalline inorganic oxide may be grown as merged whole during the phase separation process and then it is difficult for the nucleated crystalline inorganic oxide regions to exist in the form of spaced apart quantum dots. On the other hand, if the weight ratio (Wa/(Wc+Wa)) exceeds 90%, there may not be enough of the crystal-forming material to form nucleated regions of sufficient size and it then is not easy to prepare the quantum dots themselves.

Figure 5:
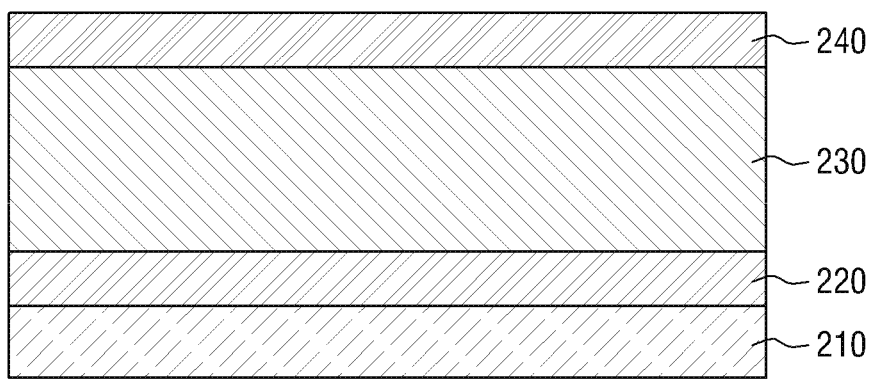
FIG. 5 is a schematic vertical cross-sectional view of the configuration of a general organic light emitting display (OLED)
Figure 6:
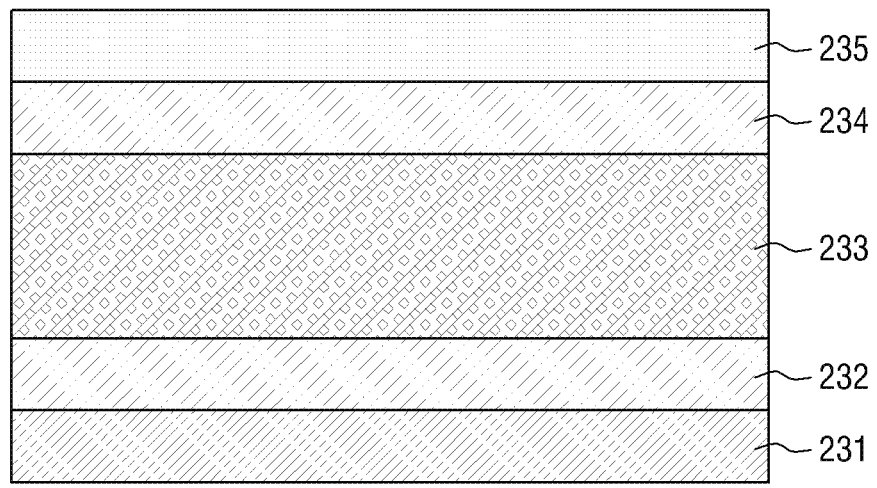
FIG. 6 is a schematic vertical cross-sectional view of the configuration of an organic light emitting layer of an organic light emitting display.

FIG. 5 is a schematic vertical cross-sectional view of a first configuration for a general organic light emitting display device that includes an organic layer 230. FIG. 6 is a schematic vertical cross-sectional view of a specific and more detailed configuration for the organic light emitting layer 230 of the organic light emitting display device of FIG. 5.

Referring to FIGS. 5 and 6, the organic light emitting display device includes a substrate 210, first and second electrodes 220 and 240 formed on the substrate 210, and an organic light emitting layer 230 interposed between the first electrode 220 and the second electrode 240. At least one of the first and second electrodes, 220 and 240 is a light-passing one. The substrate 210 may also be a light-passing one.

The first electrode 220 may be made of any material which has conductivity and can be used as an electrode. Depending on the emission direction of the light, the first electrode 220 may be made of a transparent material or a reflective material. Further, the first electrode is electrically connected to a switching element (not illustrated) included in the substrate 210 and may be operated by a switching signal that is received from the switching element. As an example, the first electrode 220 may function as an anode that supplies positive charges (e.g., holes) into its side of the organic light emitting layer 230.

The organic light emitting layer 230 may include, for example, a hole injection layer 231, a hole transport layer 232, a light emitting layer 233, an electron transport layer 234, and an electron injection layer 235. However, the hole injection layer 231 and the electron injection layer 235 may be optionally included or may be excluded.

The light emitting layer 233 functions as a region in which hole-electron recombination and the corresponding light emission (photon emission) occur. The remaining layers serve to transport the respective holes and electrons from the first electrode 220 and the second electrode 240 respectively to the light emitting layer 233. In this structure, the light emitting layer 233 may be selected to generate not only preferable color light emission but also high luminance yield, and the electron transport layer 234 and the hole transport layer 232 may be optimized in their charge carrier transport properties.

The second electrode 240 is formed on the organic light emitting layer 230. In the same manner as the first electrode 220, the second electrode 220 may be made of any material which has conductivity and can be used as an electrode. Depending on the emission direction of the light, the second electrode 240 may be made of a transparent material or a reflective material.

In the organic light emitting display device, if electric potential is applied between the first electrode 220 and the second electrode 240, the second electrode 240 injects electrons to the electron transport layer 234 through the electron injection layer 235, and the electrons move to the light emitting layer 233 through the electron transport layer 234. Simultaneously, the holes are injected from the first electrode 220 to the hole transport layer 232 through the hole injection layer 231. The holes move through the hole injection layer 231 and the hole transport layer 232, and are recombined with the electrons in the light emitting layer 233 or on an interface between the hole transport layer 232 and the light emitting layer 233. During the recombination, energy is emitted as photons through the first substrate and/or the second substrate.

Figure 7:
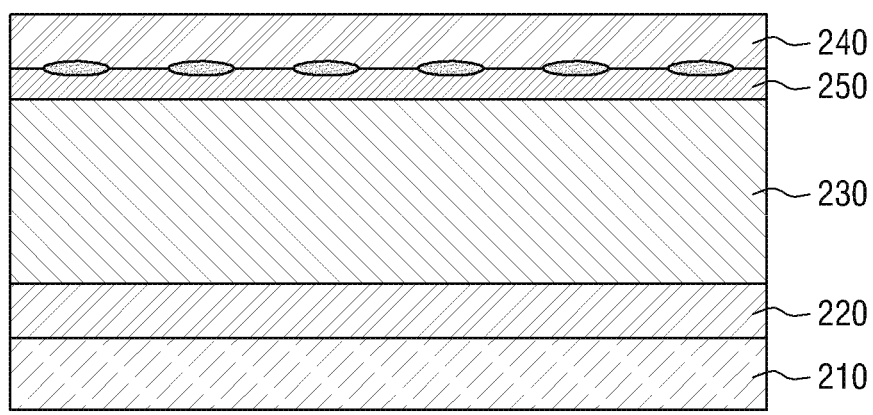
FIG. 7 is a schematic vertical cross-sectional view of the configuration of an organic light emitting display according to an embodiment of the present disclosure.

FIG. 7 is a schematic vertical cross-sectional view of a first configuration of an organic light emitting display device according to an embodiment of the present disclosure.

Referring to FIG. 7, in the organic light emitting display according to an embodiment, light emitted from the organic light emitting layer 230 is emitted in the direction of the second electrode 240. In this case, the second electrode 240 is made of a transparent material. The first electrode 220 may be made of a reflective material, and the light emitted from the organic light emitting layer 230 may be reflected by the first electrode 220 and be emitted in the direction of the second electrode 240. Further, the first electrode 220 may be made of a transparent material, and the light that has passed through the first electrode 220 may be reflected by the substrate 210 that includes a reflective material and be emitted in the direction of the second electrode 240. The material that is used as the transparent electrode is not specially limited in so far as the material has conductivity and can transmit light, and for example, may include ITO or IZO. The material that is used as the reflective electrode is not specially limited in so far as the material has conductivity and can reflect light, and for example, may be metal, such as silver (Ag) or aluminum (Al).

The organic light emitting display of FIG. 7 includes a multi-component inorganic oxide thin film 250 disposed between the organic light emitting layer 230 and the second electrode 240. The multi-component inorganic oxide thin film 250 includes quantum dots formed of the crystalline inorganic oxide regions and the bulk amorphous inorganic oxide. The quantum dots prevent the light emitted from the organic light emitting layer 230 from being totally reflected due to the difference in refractive factor, and thus improve the light emitting efficiency of the organic light emitting display device.

Since the organic light emitting display of FIG. 7 is approximately the same as the configuration that corresponds to the organic light emitting display of FIGS. 5 and 6 except for the point that the very-thin multi-component inorganic oxide thin film 250 is included between the organic light emitting layer 230 and the second electrode 240, the duplicate description thereof will be omitted. It is assumed here that holes can pass through the very-thin multi-component inorganic oxide thin film 250 of FIG. 7.

Figure 8:
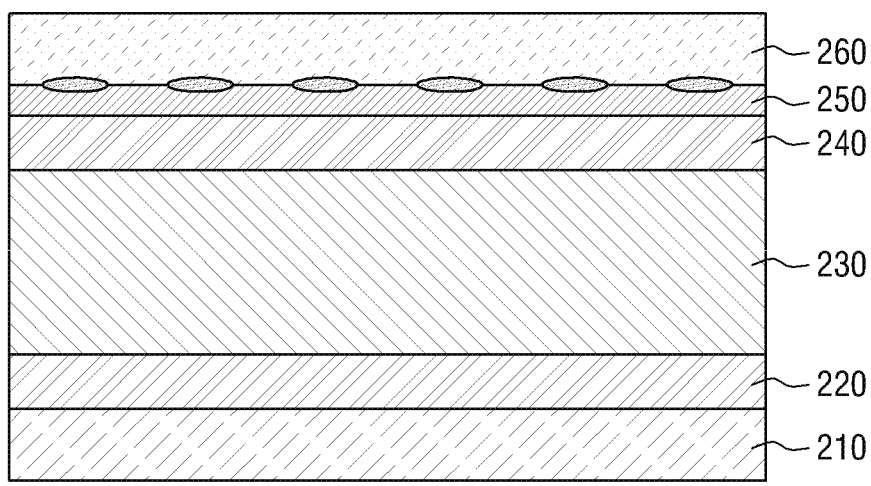
FIG. 8 is a schematic vertical cross-sectional view of the configuration of an organic light emitting display according to another embodiment of the present disclosure.

FIG. 8 is a schematic vertical cross-sectional view of another configuration of an organic light emitting display device according to another embodiment.

Referring to FIG. 8, in the organic light emitting display according to this other embodiment operates in roughly the same manner as that in FIG. 7, including that the light emitted from the organic light emitting layer 230 is emitted in the direction of the second electrode 240.

The organic light emitting display of FIG. 8 includes the multi-component inorganic oxide film 250 disposed between the second electrode 240 and an encapsulation layer 260.

Since the organic light emitting display of FIG. 8 is the same as the configuration that corresponds to the organic light emitting display of FIGS. 5 and 6 except for the point that the multi-component inorganic oxide thin film 250 is included on top of the second electrode 240 rather than under it, the duplicate description thereof will be omitted.

Figure 9:
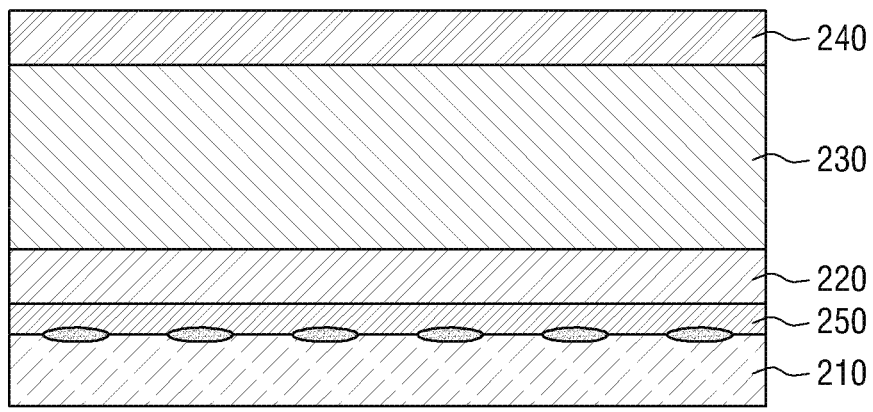
FIG. 9 is a schematic vertical cross-sectional view of the configuration of an organic light emitting display according to still another embodiment of the present disclosure.

FIG. 9 is a schematic vertical cross-sectional view of the configuration of an organic light emitting display according to still another embodiment in accordance with the present disclosure of invention.

Referring to FIG. 9, in the organic light emitting display according to this still another embodiment, light emitted from the organic light emitting layer 230 is emitted in the direction of the first electrode 220. In this case, the first electrode 220 is made of a transparent material. The second electrode 240 may be made of a reflective material, and the light emitted from the organic light emitting layer 230 may be reflected by the second electrode 240 and be emitted in the direction of the first electrode 220. The material that is used as the transparent electrode is not specially limited in so far as the material has conductivity and can transmit light, and for example, may be ITO or IZO. The material that is used as the reflective electrode is not specially limited in so far as the material has conductivity and can reflect light, and for example, may be metal, such as silver (Ag) or aluminum (Al).

The organic light emitting display of FIG. 9 includes the multi-component inorganic oxide thin film 250 disposed between the first electrode 220 and the substrate 210. The multi-component inorganic oxide thin film 250 includes quantum dots formed of the crystalline inorganic oxide and the amorphous inorganic oxide.

Since the organic light emitting display of FIG. 9 is the same as the configuration that corresponds to the organic light emitting display of FIGS. 5 and 6 except for the point that the multi-component inorganic oxide thin film 250 is included between the first electrode 220 and the substrate 210, the duplicate description thereof will be omitted.

Figure 10:
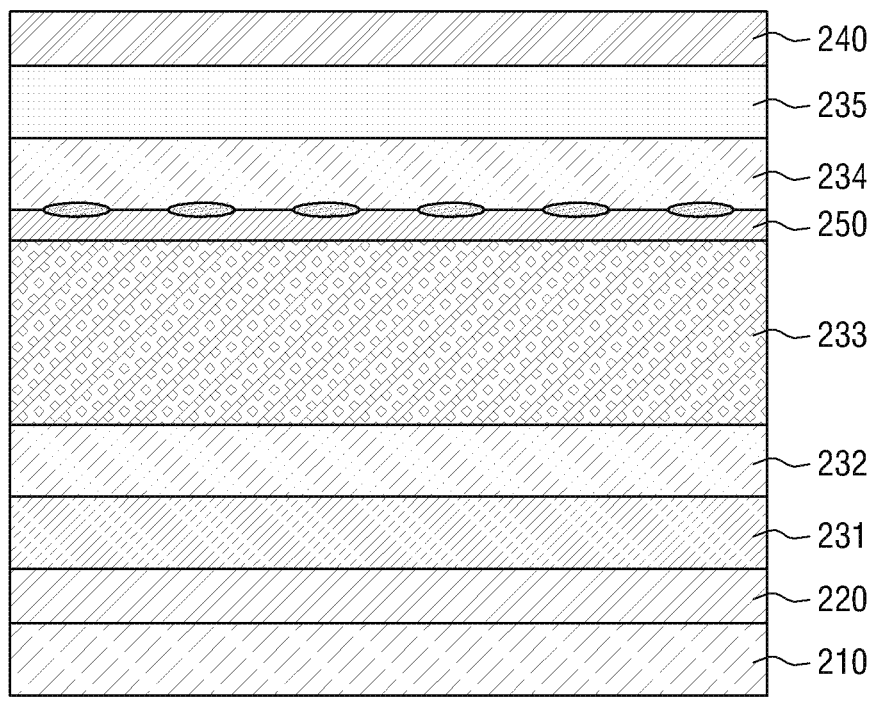
FIG. 10 is a schematic vertical cross-sectional view of the configuration of an organic light emitting display according to still another embodiment of the present disclosure.

FIG. 10 is a schematic vertical cross-sectional view of the configuration of yet another organic light emitting display according to yet another embodiment.

Referring to FIG. 10, in the organic light emitting display according to this still another embodiment, the light emitted from the light emitting layer 233 is emitted in the direction of the second electrode 240.

The organic light emitting display of FIG. 10 includes the multi-component inorganic oxide film 250 disposed between the light emitting layer 233 and the electron transport layer 234. According to circumstances, the multi-component inorganic oxide thin film 250 may be used in replacement of the electron transport layer 234 and/or the electron injection layer 235.

The position of the multi-component inorganic oxide thin film 250 is not specially limited in so far as it is on the light emission path. According to circumstances, a part of the organic light emitting layer 230 may be replaced by the multi-component inorganic oxide thin film 250.

Since the organic light emitting display of FIG. 10 is the same as the configuration that corresponds to the organic light emitting display of FIGS. 5 and 6 except for the point that the multi-component inorganic oxide thin film 250 is included between the light emitting layer 233 and the electron transport layer 234, the duplicate description thereof will be omitted.

Figure 11:
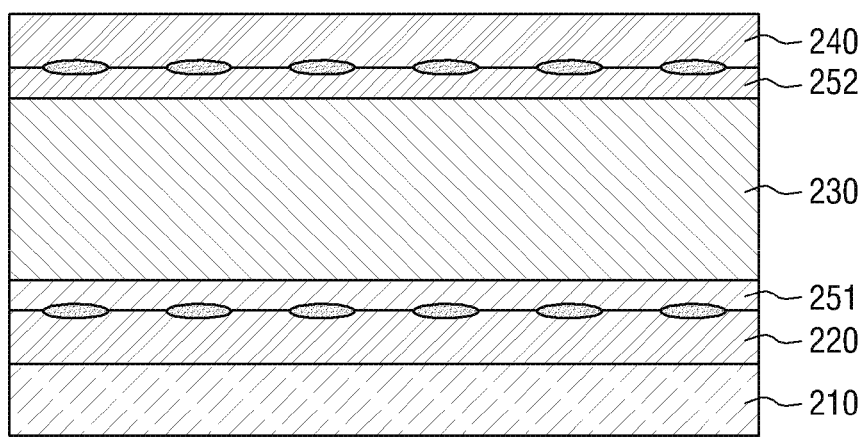
FIG. 11 is a schematic vertical cross-sectional view of the configuration of an organic light emitting display according to still another embodiment of the present disclosure.

FIG. 11 is a schematic vertical cross-sectional view of the configuration of a further organic light emitting device according to still another embodiment.

Referring to FIG. 11, in the organic light emitting device according to still another embodiment, the light emitted from the light emitting layer 233 is emitted in both directions of the first electrode 220 and the second electrode 240.

While the organic light emitting display of FIG. 8 includes one multi-component inorganic oxide film 250 disposed between the second electrode 240 and an encapsulation layer 260, in the case of FIG. 11 a first multi-component inorganic oxide thin film 251 is included between the organic light emitting layer 230 and a second multi-component inorganic oxide thin film 252 is included between the organic light emitting layer 230 and the second electrode 240. Except for this, the organic light emitting display of FIG. 11 is the substantially the same as the configuration that corresponds to the organic light emitting display of FIGS. 5 and 6, and thus the duplicate description thereof will be omitted.

Figure 12:
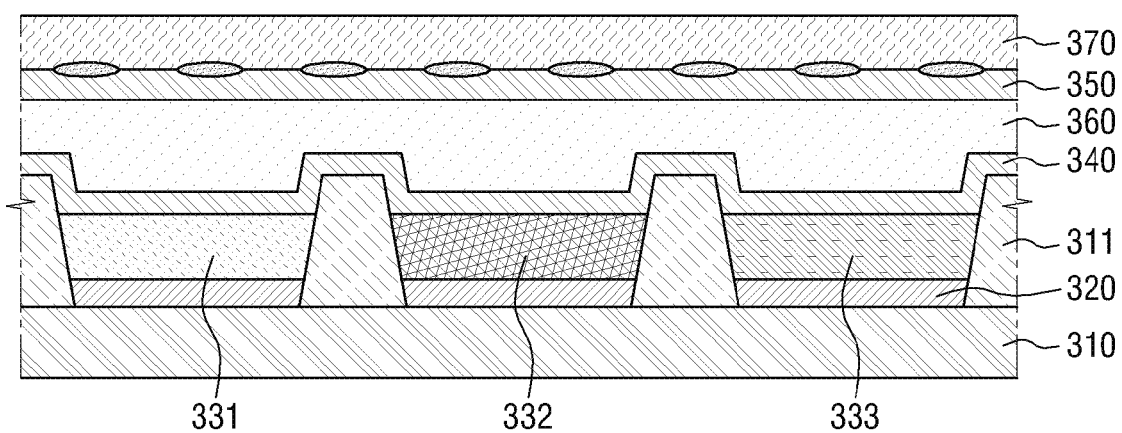
FIG. 12 is a schematic vertical cross-sectional view of the configuration of an organic light emitting display according to still another embodiment of the present disclosure.

FIG. 12 is a schematic vertical cross-sectional view of the configuration of an organic light emitting display device according to still another embodiment.

Referring to FIG. 12, the organic light emitting display according to this still another embodiment includes a substrate 310, a pixel boundary defining film 311 formed on the substrate 310 to define respective boundaries of each pixel, and a respective first electrode 320 formed in each respective pixel region that is defined by the boundaries of the pixel defining film 311 on the substrate 310. Organic light emitting layers 331, 332, and 333 are formed on the first electrode 320 in each pixel region that is divided by the pixel defining film 311. A second electrode 340 is formed on the organic light emitting layer 330 and the pixel defining film 311. A planarization layer 360 is formed on the second electrode. A multi-component inorganic oxide thin film 350, and an encapsulation layer 370 are formed as shown on the multi-component inorganic oxide thin film 350.

The pixel defining film 311 is a portion that does not emit light, and defines the pixel region that is a light emitting region. The pixel defining film 311 may be made of, for example, a material that the light does not penetrate, or a multilayer structure including the above-described layers. Accordingly, it is preferable that the pixel defining film 311 is formed on a region that corresponds to the switching element (not illustrated) in the substrate 310.

The organic light emitting layers 331, 332, and 333 may respectively output different colors. For example, they may be layers that emit colors of red 331, green 332, and blue 333. In this case, a resonance structure between reflective interfaces is formed through adjustment so that the distance for example between the first electrode 320 and the second electrode 340 differs to match the respective output wavelengths of the respective organic light emitting layers 331, 332, and 333, and thus the light emitting efficiency can be improved.

The planarization layer 360 is arranged to supplement the different thicknesses, and it is preferable that the planarization layer 360 is made of a transparent material.

In the case of the organic light emitting display including the resonance structure, it is preferable that the multi-component inorganic oxide thin film 350 is arranged on the outside of the resonance region between the first electrode 320 and the second electrode 340. More specifically, if the multi-component inorganic oxide thin film 350 had been positioned inside the resonance region, it would be difficult to fully obtain the effect caused by the resonance structures.

Except for this, the organic light emitting display of FIG. 12 is the same as the configuration that corresponds to the organic light emitting display of FIGS. 5 and 6, and thus the duplicate description thereof will be omitted.

Although specific embodiments in accordance with the present disclosure of invention have been described for illustrative purposes, those skilled in the art will appreciate in view of this disclosure that various modifications, additions and substitutions are possible, without departing from the present teachings.

What is claimed is:

1. A structure comprising a quantum-dots containing multi-component inorganic oxide thin film, the thin film having an amorphous inorganic oxide bulk region and a plurality of crystalline inorganic oxide regions dispersed in the bulk region,
wherein the crystalline inorganic oxide regions are discontinuously formed to be each surrounded by the amorphous inorganic oxide of the bulk region.

2. The structure of claim 1, wherein the crystalline inorganic oxide is a single crystal inorganic oxide.

3. The structure of claim 1, wherein an average diameter of the crystalline inorganic oxide regions is in the range of 2 nm to 10 nm.

4. The structure of claim 1, wherein the amorphous inorganic oxide and the crystalline inorganic oxide are provided in accordance with an amorphous to whole weight ratio (Wa/(Wc+Wa)) of 7:3 to 9:1.

5. The structure of claim 1, wherein the thin film has a thickness in the range of 10 nm to 100 nm.

6. The structure of claim 1, wherein the crystalline inorganic oxide appears in the form of quantum dots.

7. A method for preparing a quantum-dots containing multi-component inorganic oxide thin film, comprising:
preparing a mixture of different inorganic oxides where at least one of the inorganic oxides becomes amorphous at a predetermined temperature (Tc) and at least another one of the inorganic oxides becomes crystalline at the predetermined temperature;
providing the mixture as a solid thin film on a base material; and
forming quantum dots through performing a heat treatment on at least a surface of the thin film at the predetermined temperature (Tc).

8. The method of claim 7, wherein in the thin film, the at least one inorganic oxide that becomes amorphous at the specific temperature and the at least one inorganic oxide that becomes crystalline at the specific temperature are homogeneously mixed at a molecular level.

9. The method of claim 7, wherein the specific temperature (Tc) is in the range of 300° C. to 500° C.

10. The method of claim 7, wherein the providing the mixture as a solid thin film include providing the mixture in a solidifiable solution that is applied to the base material by a spin coating method.

11. The method of claim 7, wherein the heat treatment is performed using a laser irradiation method.

12. The method of claim 7, wherein the inorganic oxide that becomes amorphous at the specific temperature includes magnesium (Mg).

13. The method of claim 7, wherein the inorganic oxide that becomes crystalline at the specific temperature includes one or more selected from the group including zinc (Zn), tin (Sn), and nickel (Ni).

14. The method of claim 7, wherein the inorganic oxide that becomes amorphous at the specific temperature and the inorganic oxide that becomes crystalline at the specific temperature are mixed with an amorphous to whole weight ratio (Wa/(Wc+Wa)) of 7:3 to 9:1.

15. An organic light emitting display comprising a substrate, an anode, an organic light emitting layer, a cathode, and a multi-component inorganic oxide thin film according to claim 1.

16. The organic light emitting display of claim 15, wherein the multi-component inorganic oxide thin film is positioned in a path through which light of a light emitting layer is emitted.

17. The organic light emitting display of claim 15, wherein the multi-source inorganic oxide thin film is positioned between the cathode and the organic light emitting layer, between the anode and the organic light emitting layer, or between the cathode and the anode.

18. The organic light emitting display of claim 15, further comprising a resonance region in which light emitted from an organic light emitting layer resonates,
wherein the multi-component inorganic oxide thin film is arranged on an outside of the resonance region.

19. The organic light emitting display of claim 15, wherein the multi-component inorganic oxide thin film is used as the anode or the cathode.

* * * * *